(12) United States Patent
Chang et al.

(10) Patent No.: US 12,297,998 B2
(45) Date of Patent: May 13, 2025

(54) LIGHT EMITTING MODULE

(71) Applicant: Darwin Precisions Corporation, Hsinchu County (TW)

(72) Inventors: Yu-Cheng Chang, Hsinchu County (TW); Yu-Ming Huang, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 17/680,679

(22) Filed: Feb. 25, 2022

(65) Prior Publication Data

US 2022/0282850 A1  Sep. 8, 2022

(30) Foreign Application Priority Data

Mar. 2, 2021 (TW) ................................. 110107398

(51) Int. Cl.
*F21V 5/00* (2018.01)
*F21V 19/00* (2006.01)

(52) U.S. Cl.
CPC .............. *F21V 5/007* (2013.01); *F21V 5/002* (2013.01); *F21V 19/001* (2013.01)

(58) Field of Classification Search
CPC . F21V 5/002; F21V 5/007; F21V 5/02; F21Y 2105/10–18; H01L 23/28–3192
See application file for complete search history.

(56) References Cited

U.S. PATENT DOCUMENTS

| | | | |
|---|---|---|---|
| 2006/0044803 A1 | 3/2006 | Edwards | |
| 2010/0265694 A1* | 10/2010 | Kim | G02B 6/0021 362/97.1 |
| 2011/0109839 A1 | 5/2011 | Zhu et al. | |
| 2011/0134648 A1* | 6/2011 | Lin | F21V 5/02 362/311.06 |
| 2012/0081882 A1* | 4/2012 | Im | G02F 1/133603 362/97.1 |
| 2016/0211471 A1 | 7/2016 | Kwon et al. | |

(Continued)

FOREIGN PATENT DOCUMENTS

| | | |
|---|---|---|
| CN | 101471416 A | 7/2009 |
| CN | 104566202 A | 4/2015 |
| CN | 110021710 A | 7/2019 |

(Continued)

*Primary Examiner* — Sean P Gramling
(74) *Attorney, Agent, or Firm* — WPAT, PC

(57) ABSTRACT

A light emitting module is disclosed. The light emitting module includes a board, a plurality of light sources, and a package layer. The board includes a first surface. The plurality of light sources are disposed on the first surface. The package layer is disposed on the first surface, which contacts and surrounds the light sources. A plurality of micro-structure areas are defined on the face of the package layer opposite to the first surface, wherein the micro-structure areas are disconnected with each other. The orthographic projection of each micro-structure area on the first surface covers the respective orthographic projection of one of the plurality of light sources on the first surface. The package layer concaves to form a plurality of micro-structures toward the first surface in the micro-structure areas.

14 Claims, 5 Drawing Sheets

(56) References Cited

U.S. PATENT DOCUMENTS

2020/0209460 A1\* 7/2020 Achi ........................ F21V 5/04

FOREIGN PATENT DOCUMENTS

| | | |
|---|---|---|
| CN | 110264886 A | 9/2019 |
| TW | 081211881 | 2/1993 |
| TW | I279013 | 4/2007 |
| TW | 201203627 | 1/2012 |
| TW | I371122 | 8/2012 |
| TW | I419373 | 12/2013 |
| TW | 201435379 | 9/2014 |
| TW | 202036058 | 10/2020 |

\* cited by examiner

LIGHT EMITTING MODULE

BACKGROUND

Technical Field

The present invention relates to a light emitting module, and specifically, to an LED array light emitting module having micro-structure package layer.

Related Art

In a conventional design, point light sources such as LEDs are disposed in an array as planar light sources in light emitting modules, wherein optical films such as diffusion plates are usually stacked to uniformize the light to avoid seeing each point light source, i.e., to avoid the so-called "mura" effect. However, the use of optical films would increase the thickness of the light emitting module. One approach to decrease the thickness of the light emitting module is increasing the amount of LEDs, which would raise cost. As such, there is SUMMARY One of objectives of the present invention is to provide a light emitting module, capable of reducing the amount of optical films and increasing the optical efficiency.

The light emitting module of the present invention includes a board, a plurality of light sources, and a package layer. The board includes a first surface. The plurality of light sources are disposed on the first surface. The package layer is disposed on the first surface, which contacts and covers the light sources. A plurality of micro-structure areas are defined on a face of the package layer opposite to the first surface, wherein the micro-structure areas are disconnected with each other. The orthographic projection of each micro-structure area on the first surface covers the orthographic projection of one of the plurality of light sources on the first surface. The package layer concaves to form a plurality of micro-structures toward the first surface in the micro-structure areas.

DETAILED DESCRIPTION

Figure 1:
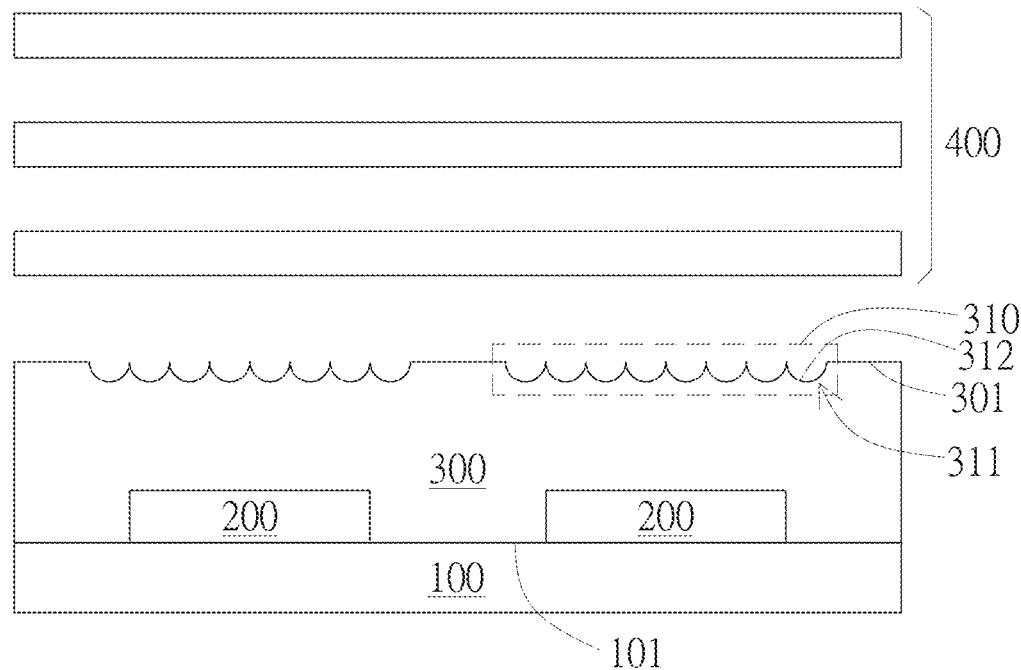
FIG. 1 is a schematic diagram of an embodiment of a light emitting module.

Implementations of a connection assembly disclosed by the present invention are described below by using particular and specific embodiments with reference to the drawings, and a person skilled in the art may learn of advantages and effects of the present invention from the disclosure of this specification. However, the following disclosure is not intended to limit the protection scope of the present invention, and a person skilled in the art may carry out the present invention by using other different embodiments based on different viewpoints without departing from the concept and spirit of the present invention. In the accompanying drawings, plate thicknesses of layers, films, panels, regions, and the like are enlarged for clarity. Throughout the specification, same reference numerals indicate same elements. It should be understood that when an element such as a layer, film, region or substrate is referred to as being "on" or "connected" to another element, it may be directly on or connected to the another element, or intervening elements may also be present. In contrast, when an element is referred to as being "directly on" or "directly connected to" another element, there is no intervening element present. As used herein, "connection" may refer to a physical and/or electrical connection. Further, "electrical connecting" or "coupling" may indicate that another element exists between two elements.

It should be noted that the terms "first", "second", "third", and the like that are used in the present disclosure can be used for describing various elements, components, regions, layers and/or portions, but the elements, components, regions, layers and/or portions are not limited by the terms. The terms are merely used to distinguish one element, component, region, layer, or portion from another element, component, region, layer, or portion. Therefore, the "first element", "component", "region", "layer", or "portion" discussed below may be referred to as a second element, component, region, layer, or portion without departing from the teaching of this disclosure.

In addition, relative terms, such as "down" or "bottom" and "up" or "top", are used to describe a relationship between an element and another element, as shown in the figures. It should be understood that the relative terms are intended to include different orientations of a device in addition to orientations shown in the figures. For example, if a device in a figure is turned over, an element that is described to be on a "lower" side of another element is directed to be on an "upper" side another element. Therefore, the exemplary terms "down" may include orientations of "down" and "up" and depends on a particular orientation of an accompanying drawing. Similarly, if a device in a figure is turned over, an element that is described as an element "below" another element or an element "below" is directed to be "above" another element. Therefore, the exemplary terms "below" or "below" may include orientations of up and down.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

As shown in the embodiment in FIG. 1, the light emitting module 900 of the present invention includes a board 100, a plurality of light sources 200, and a package layer 300. The board 100 includes a first surface 101. The plurality of light sources 200 are disposed on the first surface 101. The package layer 300 is disposed on the first surface 101, which contacts and covers the light sources 200. More particularly, the board 100 includes a printed circuit board. The light sources 200 are preferably LEDs, which are disposed on the first surface 101 of the board 100 in arrays by a chip-on-board process. The package layer 300 covers the first surface 101 and the light sources 200, and is filled between the light sources 200. The light emitting module 900 can further include optical films disposed above the package layer 300.

The package layer 300, for example, could be transparent, semitransparent, or fluorescent, and could be mixed with wavelength conversion materials such as phosphorescent materials. The package layer 300 could be made from silicon resin, epoxy, glass, plastic, or other materials, and could be formed directly onto the first surface 101 and the light sources 200 via an injection molding process.

As shown in the embodiment in FIG. 1, a plurality of micro-structure areas 310 are defined on the face 301 of the package layer 300 opposite to the first surface 101, wherein the micro-structure areas 310 are disconnected with each other. The orthographic projection of each micro-structure area 310 on the first surface 101 covers the orthographic projection of one of the plurality of light sources 200 on the first surface 101. The package layer 300 concaves to form a plurality of micro-structures 311 toward the first surface 101 in the micro-structure areas 310. In other words, parts of the package layer 300 above the light sources 200 concave to form a plurality of micro-structures 311. The areas where the micro-structures 311 are distributed are the micro-structure areas 310, wherein the downward orthographic projections of the micro-structure areas 310 cover the light sources 200. The micro-structures 311 could be formed at the same time the package layer 300 is formed via an injection molding process. The micro-structures 311 could also be formed after the package layer 300 is formed. For example, the micro-structures 311 can be formed by depositing a material the same as the package layer 300, or by removing a portion of the package layer 300 via etching, machining, or sand blasting.

The substances on the two opposite sides of the micro-structures 311 have different refractive indexes, i.e. the N values of the substances are different. In other words, the refractive index of the package layer 300 is different from the refractive index of the material on the other side of the package layer 300 with respect to the board 100. More particularly, in an embodiment, the other side of the package layer 300 with respect to the board 100 is air, i.e. the concaved portion of the micro-structures 311 formed by the package layer 300 concaving toward the first surface 101 is filled with air. In different embodiments, layers formed from different materials can be disposed on the other side of the package layer 300 with respect to the board 100, wherein the concaved portion of the micro-structures 311 formed by the package layer 300 concaving toward the first surface 101 is filled with said different material.

Figure 2A:
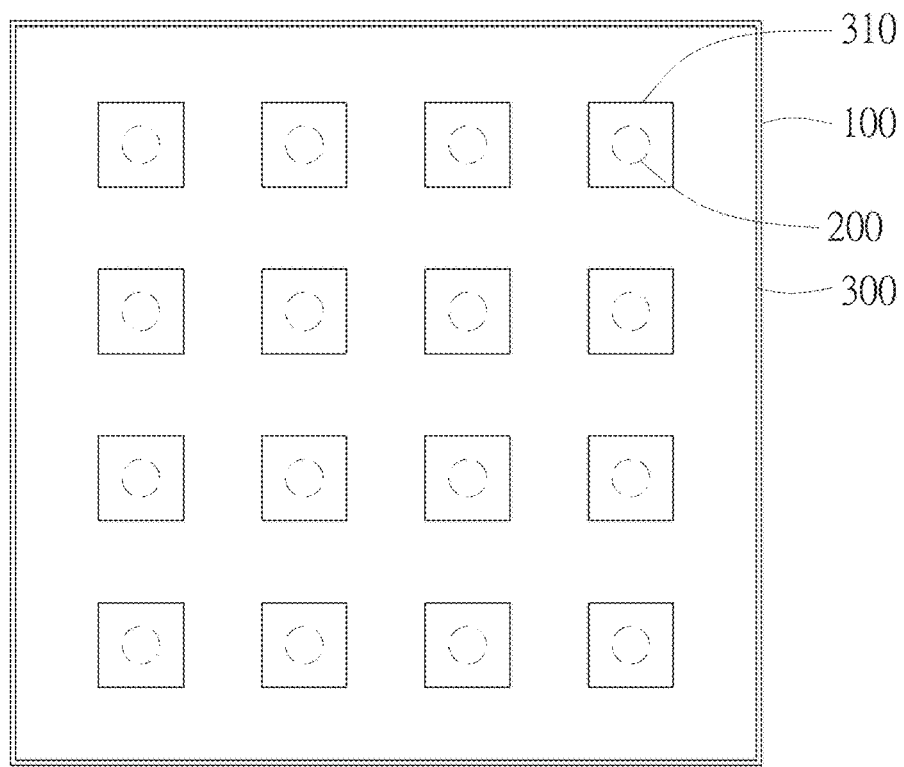
FIG. 2A is a top view of an embodiment of a light emitting module.
Figure 2B:
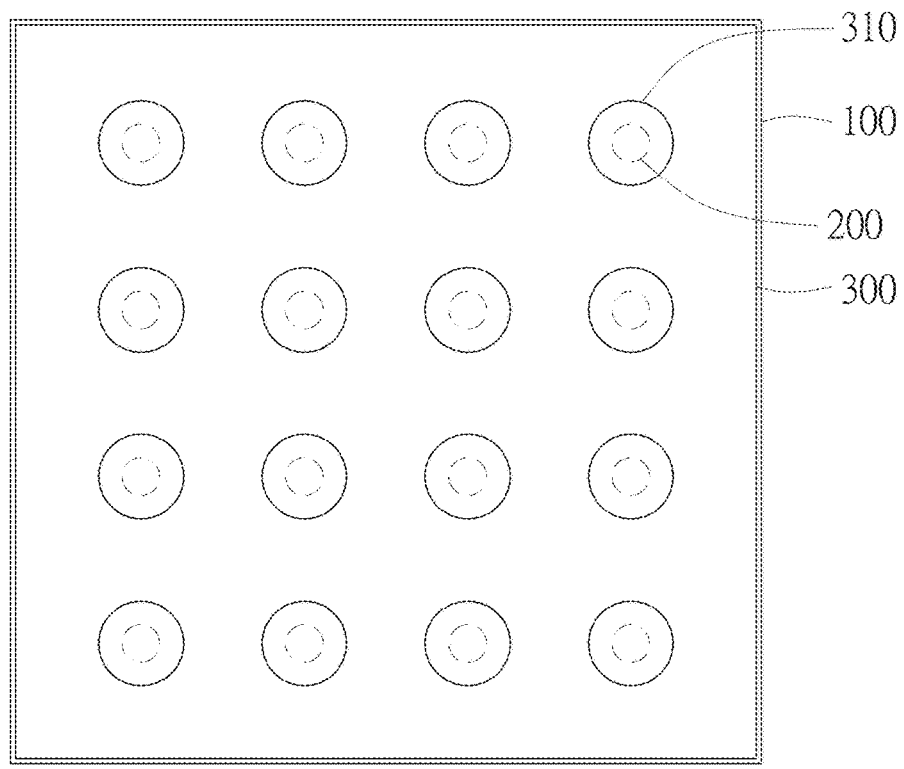
FIG. 2B is a top view of another embodiment of a light emitting module.
Figure 2C:
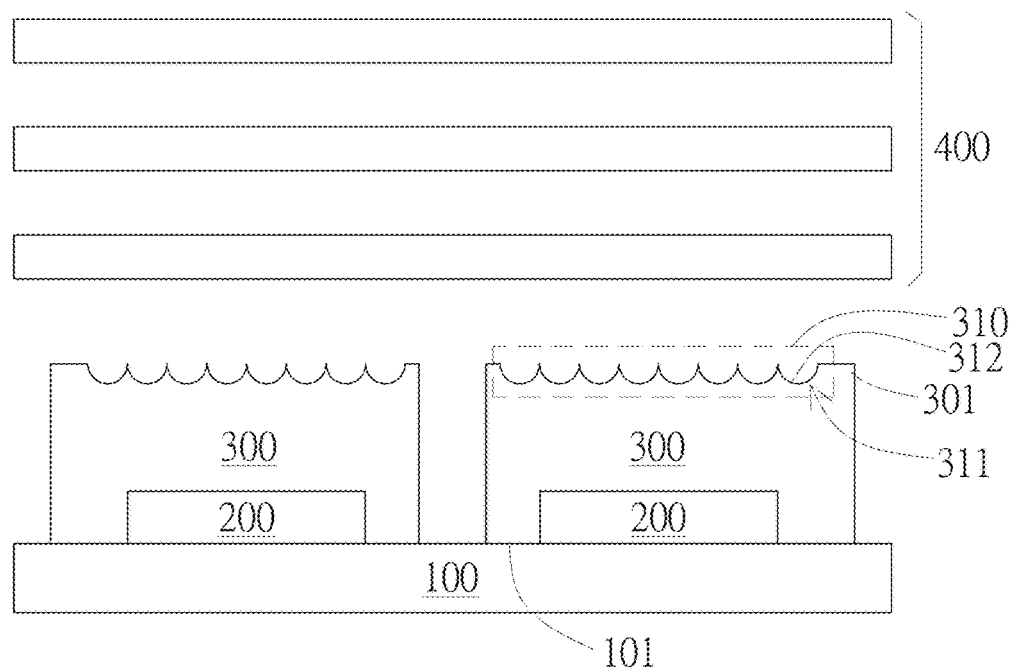
FIG. 2C is a side view of another embodiment of a light emitting module.
Figure 2D:
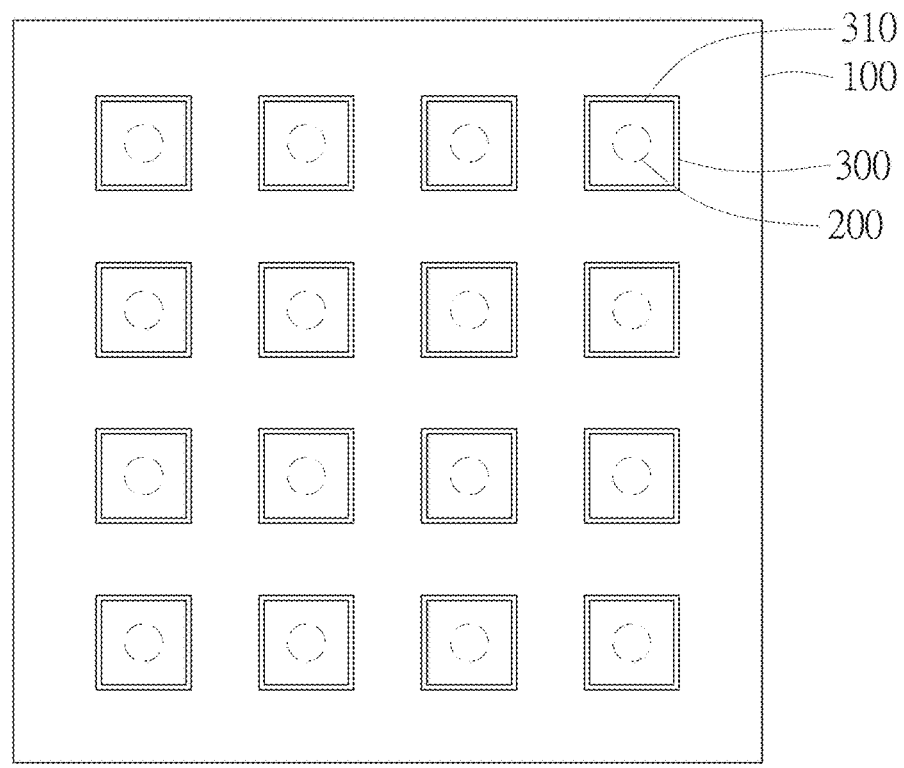
FIG. 2D is a top view of another embodiment of a light emitting module.

From a different point of view, as shown in a top view of an embodiment in FIG. 2A, the package layer 300 includes a plurality of independent micro-structure areas 310, wherein each micro-structure area 310 corresponds to one of a plurality of light sources 200 below. The shape of micro-structure area 310, i.e. the shape of the distribution range of the micro-structures 311 (see FIG. 1), could be modified according to the manufacturing, design, and usage requirements. As shown in the embodiments in FIGS. 2A and 2B, the shapes of micro-structure areas 310 are respectively square and circular. On the other hand, in the above-described embodiments, the package layer 300 is distributed on the whole of board 100. In different embodiments, however, the package layer 300 can be distributed on only parts of the board 100. As shown in a side view and a top view of different embodiments in FIGS. 2C and 2D respectively, the package layer 300 includes a plurality of disconnected portions, wherein each portion contacts and surrounds one of the light sources 200, wherein the micro-structure areas 310 are defined on the face 301 opposite to the first surface 101.

Figure 3A:
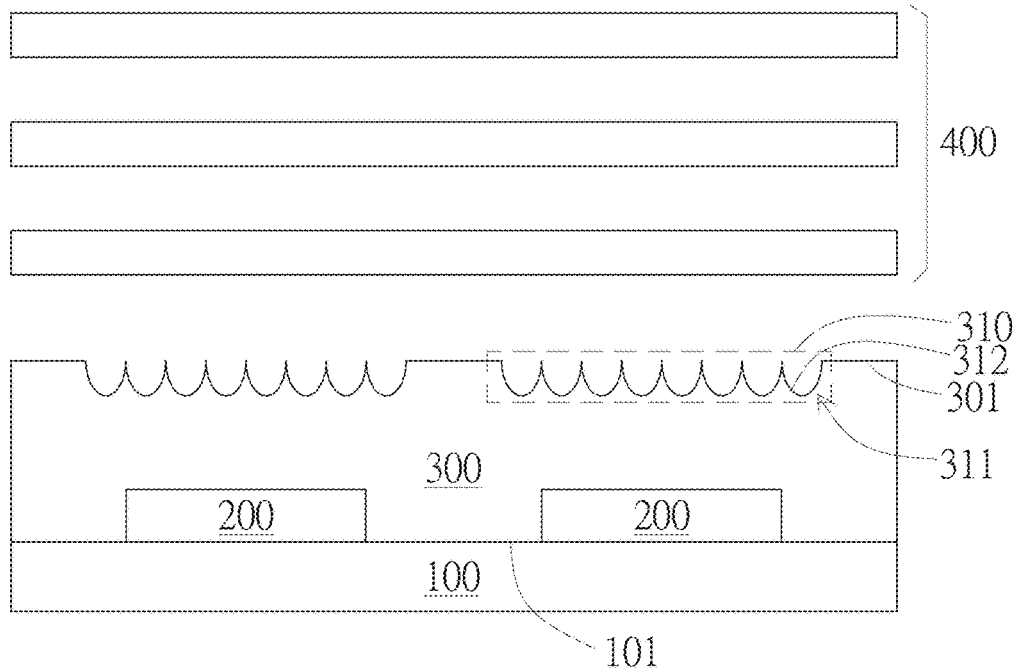
FIGS. 3A and 3B are schematic diagrams of another embodiment of a light emitting module.
Figure 3B:
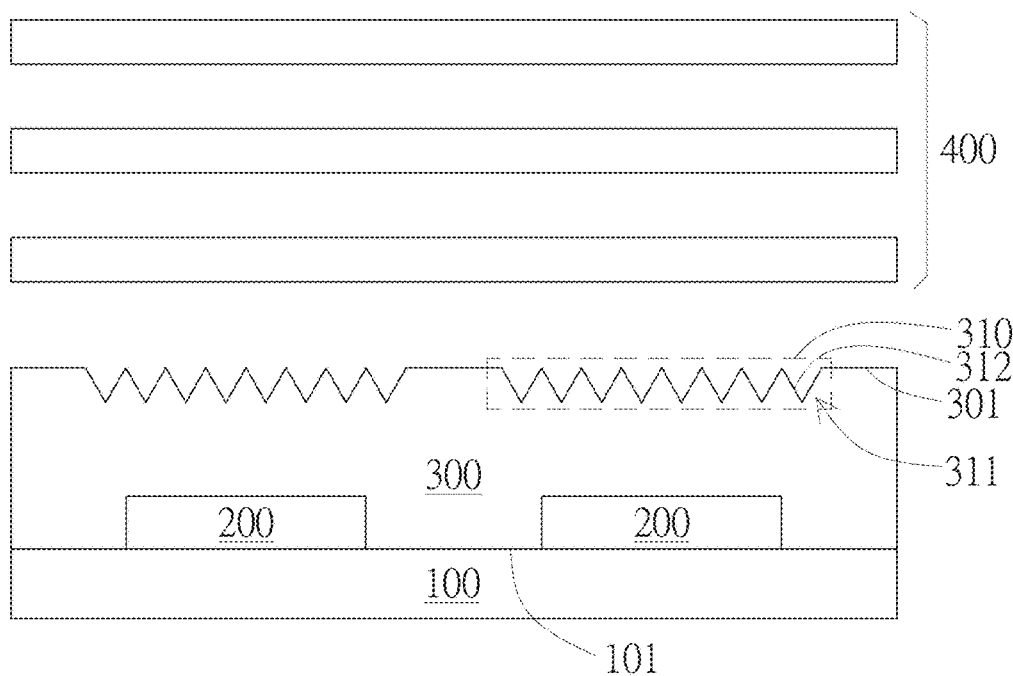

As shown in the embodiment in FIG. 1, each micro-structure 311 has a concave 312 with a semispherical inner surface. From a different point of view, in this embodiment, the package layer 300 concaves from the face 301 toward the board 100 to form the concave 312 having the feature of a semispherical inner surface. The micro-structure 311 forms substantially a semispherical chamber, wherein acute angles might be formed in the connecting parts of adjacent micro-structures 311. The sphere radius of each micro-structure is between 5 µm and 500 µm. In different embodiments, the shape of micro-structures 311 could be modified according to the manufacturing, design, and usage requirements. As shown in the embodiment in FIG. 3A, each micro-structure 311 has a concave 312 with a semi-ellipsoidal inner surface. From a different point of view, in this embodiment, the package layer 300 concaves from the face 301 toward the board 100 to form the concave 312 having the feature of a semi-ellipsoidal inner surface. The micro-structure 311 forms substantially a semi-ellipsoidal chamber. As shown in the embodiment in FIG. 3B, each micro-structure 311 has a concave 312 with a circular cone inner surface. From a different point of view, in this embodiment, the package layer 300 concaves from the face 301 toward the board 100 to form the concave 312 having the feature of a circular cone inner surface. The micro-structure 311 forms substantially a circular cone chamber. The micro-structures 311 can be formed by etching, machining, sand blasting, etc.

More particularly, in the present invention, micro-structures 311 are disposed in the micro-structure areas 310 on the surface of the package layer 300 corresponding to the light sources 200 below for dispersing the light emitted by the light sources 200. Therefore, the demand for optical films is reduced. The optical efficiency is increased. The number of the light sources 200 disposed per unit area is decreased and the spacing therebetween is enlarged.

Simulations are conducted to a light emitting module of the present invention and a conventional light emitting module via software (LightTools, CYBERNET SYSTEMS TAIWAN), wherein the parameters are shown in table 1. The simulation results are respectively shown in FIGS. 4A and 4B.

TABLE 1

| Light Emitting Module of the Present Invention | Conventional Light Emitting Module |
|---|---|
| Light Sources: Mini LED (type 0812, Lextar Electronics Corporation, Taiwan), | Light Sources: Mini LED (type 0812, Lextar Electronics Corporation, Taiwan), |

TABLE 1-continued

| Light Emitting Module of the Present Invention | Conventional Light Emitting Module |
| --- | --- |
| 5 mm Spacing, 4 × 4 Array. Package Layer: 250 μm Thickness, 1.53 refractive index, with Micro-Structures. | 5 mm Spacing, 4 × 4 Array. Package Layer: 250 μm Thickness, 1.53 refractive index, without Micro-Structures. |

Figure 4A:
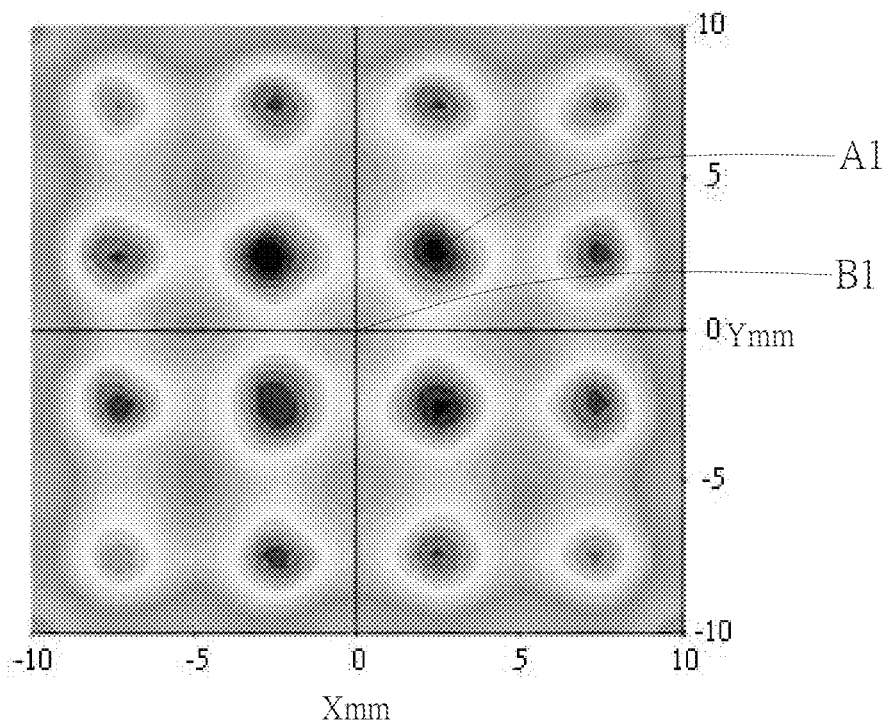
FIG. 4A is a simulation result of an embodiment of a light emitting module.
Figure 4B:
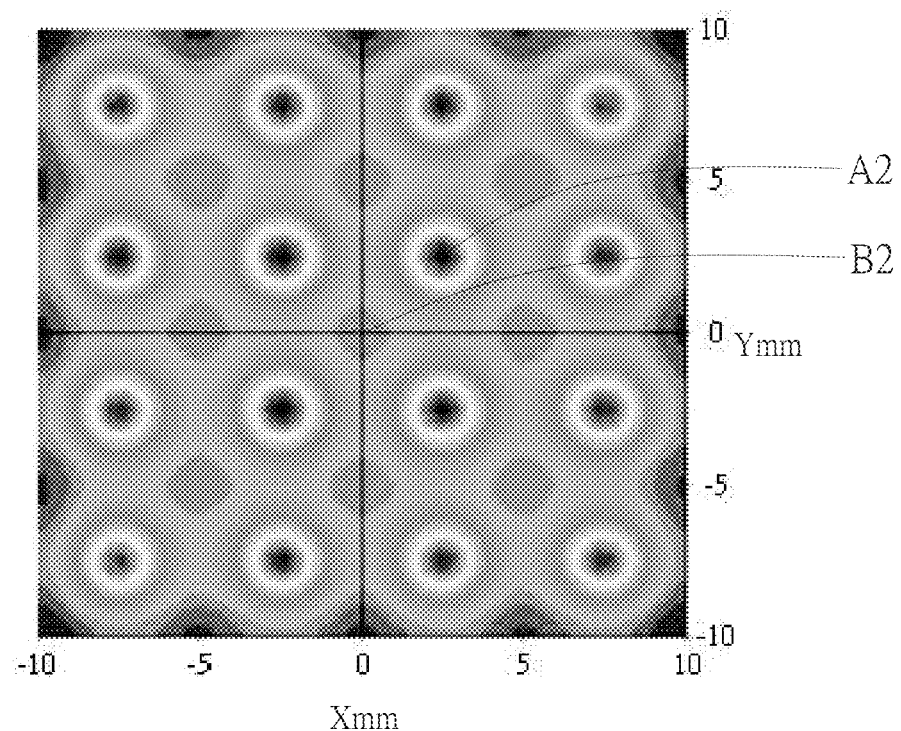
FIG. 4B is a simulation result of a conventional light emitting module.

As shown in the simulation result in FIG. 4A, the positions of A1 are right above the light sources and the positions of B1 are the centers of the spaces in between the positions right above four adjacent light sources, wherein the brightness of B1 is about 58% of the brightness of A1. As shown in the simulation result in FIG. 4B, the positions of A2 are right above the light sources and the positions of B2 are the centers of the spaces in between the positions right above four adjacent light sources, wherein the brightness of B1 is about 10% of the brightness of A1. Accordingly, even though the usage of optical films such as a diffusion plate is decreased in the light emitting module of the present invention for reducing the overall thickness, it still has better light uniformity.

The present invention is described by means of the above-described relevant embodiments. However, the above-described embodiments are only examples for implementing the present invention. It should be pointed out that the disclosed embodiments do not limit the scope of the present invention. In contrast, the spirit included in the scope of the patent application and modifications and equivalent settings made within the scope are all included in the scope of the present invention.

What is claimed is:

1. A light emitting module, comprising:
a board having a first surface;
a plurality of light sources disposed on the first surface; and
a package layer disposed on the first surface, wherein the package layer contacts and covers the light sources;
wherein a plurality of micro-structure areas are defined on a face of the package layer opposite to the first surface, wherein the micro-structure areas are disconnected with each other, wherein the orthographic projection of each micro-structure area on the first surface covers the orthographic projection of one of the plurality of light sources on the first surface, wherein each micro-structure area which covers the orthographic projection of one of the plurality of light sources comprise a plurality of micro-structures, wherein the package layer concaves to form the plurality of micro-structures toward the first surface in the micro-structure areas, wherein the plurality of micro-structures in each micro-structure area are identical in their shapes, wherein the package layer and the plurality of micro-structures are formed in one piece, wherein the light emitted to micro-structure areas is refracted by the plurality of micro-structures, wherein the package layer is made from material selected from the group consisting of silicon resin, epoxy, glass, and plastic, wherein there isn't any reflective material in the plurality of micro-structures for reflecting the light emitted to micro-structure areas, wherein acute angles are formed in the connecting parts of adjacent micro-structures, wherein the package layer includes a plurality of disconnected portions, where each portion contacts and surrounds one of the light sources, wherein the micro-structure areas are defined on the opposite face with respect to the first surface.

2. The light emitting module according to claim 1, wherein the refractive index of the package layer is different from the refractive index of a material on the other side of the package layer with respect to the board.

3. The light emitting module according to claim 1, wherein the other side of the plurality of micro-structures with respect to the board is air.

4. The light emitting module according to claim 3, wherein each micro-structure has a concave with a semi-spherical inner surface.

5. The light emitting module according to claim 4, wherein the sphere radius of each micro-structure is between 5 μm and 500 μm.

6. The backlight module according to claim 3, wherein each micro-structure has a concave with a semiellipsoidal inner surface.

7. The light emitting module according to claim 3, wherein each micro-structure has a concave with circular cone inner surface.

8. A light emitting module, comprising:
a board having a first surface;
a plurality of light sources disposed on the first surface; and
a plurality of package layers disposed on the first surface, wherein each of the package layers contacts and surrounds one of the light sources;
wherein each of the package layers concaves from the opposite face with respect to the first surface toward the first surface to form a plurality of micro-structures, wherein the plurality of micro-structures are identical in their shapes, wherein the package layer and the plurality of micro-structures are formed in one piece, wherein the package layer is made from material selected from the group consisting of silicon resin, epoxy, glass, and plastic, wherein there isn't any reflective material in the plurality of micro-structures for reflecting the light emitted to micro-structure areas, wherein acute angles are formed in the connecting parts of adjacent micro-structures.

9. The light emitting module according to claim 8, wherein the refractive index of the package layer is different from the refractive index of a material on the other side of the package layer with respect to the board.

10. The light emitting module according to claim 8, wherein the other side of the plurality of micro-structures with respect to the board is air.

11. The light emitting module according to claim 10, wherein each micro-structure has a concave with a semi-spherical inner surface.

12. The light emitting module according to claim 11, wherein the sphere radius of each micro-structure is between 5 μm and 500 μm.

13. The backlight module according to claim 10, wherein each micro-structure has a concave with a semiellipsoidal inner surface.

14. The light emitting module according to claim 10, wherein each micro-structure has a concave with circular cone inner surface.

* * * * *